(12) United States Patent
Sumida et al.

(10) Patent No.: US 6,296,145 B1
(45) Date of Patent: Oct. 2, 2001

(54) PARTS FEEDER USING STRIP CARRIER

(75) Inventors: Hiroto Sumida, Ikoma; Kunio Tanaka, Osaka; Toshihiko Nagaya, Osaka; Tomonori Fujita, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/497,128

(22) Filed: Feb. 3, 2000

(30) Foreign Application Priority Data

Feb. 5, 1999 (JP) .................................................. 11-028233

(51) Int. Cl.$^7$ ...................................................... B65H 5/28
(52) U.S. Cl. ........................................... 221/70; 198/803.6
(58) Field of Search .................................. 221/69, 70, 71, 221/72, 73, 82, 76, 89, 87; 198/396, 459.1, 803.3, 803.6

(56) References Cited

U.S. PATENT DOCUMENTS 5,836,437    11/1998    Saito et al. .

FOREIGN PATENT DOCUMENTS 0876091    11/1998   (EP) .
07 038286    2/1995   (JP) .

*Primary Examiner*—Kenneth W. Noland
(74) *Attorney, Agent, or Firm*—Connolly Bove Lodge & Hutz

(57) ABSTRACT

A parts feeder is provided which is designed to pick up parts carried by a strip carrier. The strip carrier is moved intermittently to a pickup station and has storage chambers arrayed in a lengthwise direction thereof. The storage chambers has openings and stores therein the parts each of which has formed on ends thereof electrodes having at least a magnetic portion. A magnet which has a non-pole face oriented to the strip carrier is disposed at the pickup station for magnetically keeping each of the parts in a desired orientation within one of the storage chambers.

25 Claims, 6 Drawing Sheets

PARTS FEEDER USING STRIP CARRIER

BACKGROUND OF THE INVENTION

1. Technical Field of the Invention

The present invention relates generally to a parts feeder using a strip carrier, and more particularly to a parts feeder designed to hold parts being transported in an orientation required to be picked up by a vacuum pickup.

2. Background Art

Parts feeders are known which have a strip carrier and a vacuum pickup. The strip carrier stores small parts in recesses formed in line and is moved intermittently to a pickup station. The vacuum pickup is disposed above a travel path of the strip carrier to pick up the parts one from each of the recesses of the strip carrier.

Such prior art parts feeders have a drawback in that vibrations of the strip carrier during moving may cause the parts to stand vertically, thereby making it difficult to take up the parts from the recesses using the vacuum pickup.

SUMMARY OF THE INVENTION

It is therefore a principal object of the present invention to avoid the disadvantages of the prior art.

It is another object of the present invention to provide a parts feeder designed to hold parts being transported in an orientation required to be picked up at a pickup station.

According to one aspect of the invention, there is provided a parts feeding apparatus which comprises: (a) a pickup station; (b) a strip carrier moved intermittently to the pickup station along a given travel path, the strip carrier having storage chambers arrayed in a lengthwise direction thereof, the storage chambers having openings and storing therein parts each of which is made of a plate member and has electrodes formed on ends thereof, the electrodes having at least a magnetic portion; (c) a pickup picking up one of the parts from a corresponding one of the openings of the storage chambers of the strip carrier upon arriving at the pickup station; and (d) a magnet disposed at the pickup station so as to be opposed to the pickup through the strip carrier for magnetically keeping each of the parts in a desired orientation within one of the storage chambers, the magnet having a non-pole face oriented to the strip carrier.

According to the second aspect of the invention, there is provided a parts feeding apparatus which comprises: (a) a pickup station; (b) a strip carrier moved intermittently to the pickup station along a given travel path, the strip carrier having storage chambers arrayed in a lengthwise direction thereof, the storage chambers having openings and storing therein parts each of which is made of a plate member and has electrodes formed on ends thereof, the electrodes having at least a magnetic portion; (c) a pickup picking up one of the parts from a corresponding one of the openings of the storage chambers of the strip carrier upon arriving at the pickup station; and (d) a magnet disposed at the pickup station beneath the pickup, the magnet having a length extending from a downstream side to an upstream side of the pickup for magnetically keeping each of the parts in a desired orientation within one of the storage chambers, the magnet having a non-pole face oriented to the strip carrier.

According to the third aspect of the invention, there is provided a parts feeding apparatus which comprises: (a) a pickup station; (b) a strip carrier moved intermittently to the pickup station along a given travel path, the strip carrier having storage chambers arrayed in a lengthwise direction thereof, the storage chambers having openings and storing therein parts each of which is made of a plate member and has electrodes formed on ends thereof, the electrodes having at least a magnetic portion; (c) a pickup picking up one of the parts from a corresponding one of the openings of the storage chambers of the strip carrier upon arriving at the pickup station; and (d) a magnet disposed at the pickup station, the magnet having a length extending from at least a lower side of the pickup to an upstream side of the pickup for magnetically keeping each of the parts in a desired orientation within one of the storage chambers. The magnet has a non-pole face oriented to the strip carrier and a width in a direction perpendicular to a length of the strip carrier which is greater than that of the parts.

In the preferred mode of the invention, the strip carrier also has a cover tape covering the openings of the storage chambers. A stripping portion is further disposed upstream of the pickup station to strip the cover tape off the strip carrier. The length of the magnet extends from an upstream side of the stripping portion to the downstream side of the pickup.

A non-magnetic supporting member is disposed over the magnet on which the strip carrier moves. The supporting member has a recessed portion greater than each of the openings of the storage chambers for allowing the strip carrier to be deformed when pressed by the pickup at the pickup station, thereby preventing the parts from sticking in the bottom of the strip carrier. The supporting member is made of an elastic material. A pressure member is disposed so as to urge the strip carrier against the supporting member.

The magnet may be disposed within the supporting member.

The magnet may be arranged so as to expose the non-pole face to the recessed portion of the supporting member.

An distance adjusting means may further be provided for adjusting a distance between the parts and the non-pole face of the magnet.

Each if the parts has an upper surface, a lower surface, a pair of first opposed side surfaces, and a pair of second opposed side surfaces formed adjacent the first opposed surfaces. Each of the electrodes extends from an end portion of the upper surface to an end portion of the lower surface across one of the first opposed surfaces without occupying the second opposed surfaces.

The magnet may be a ferrite magnet.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

Figure 1:
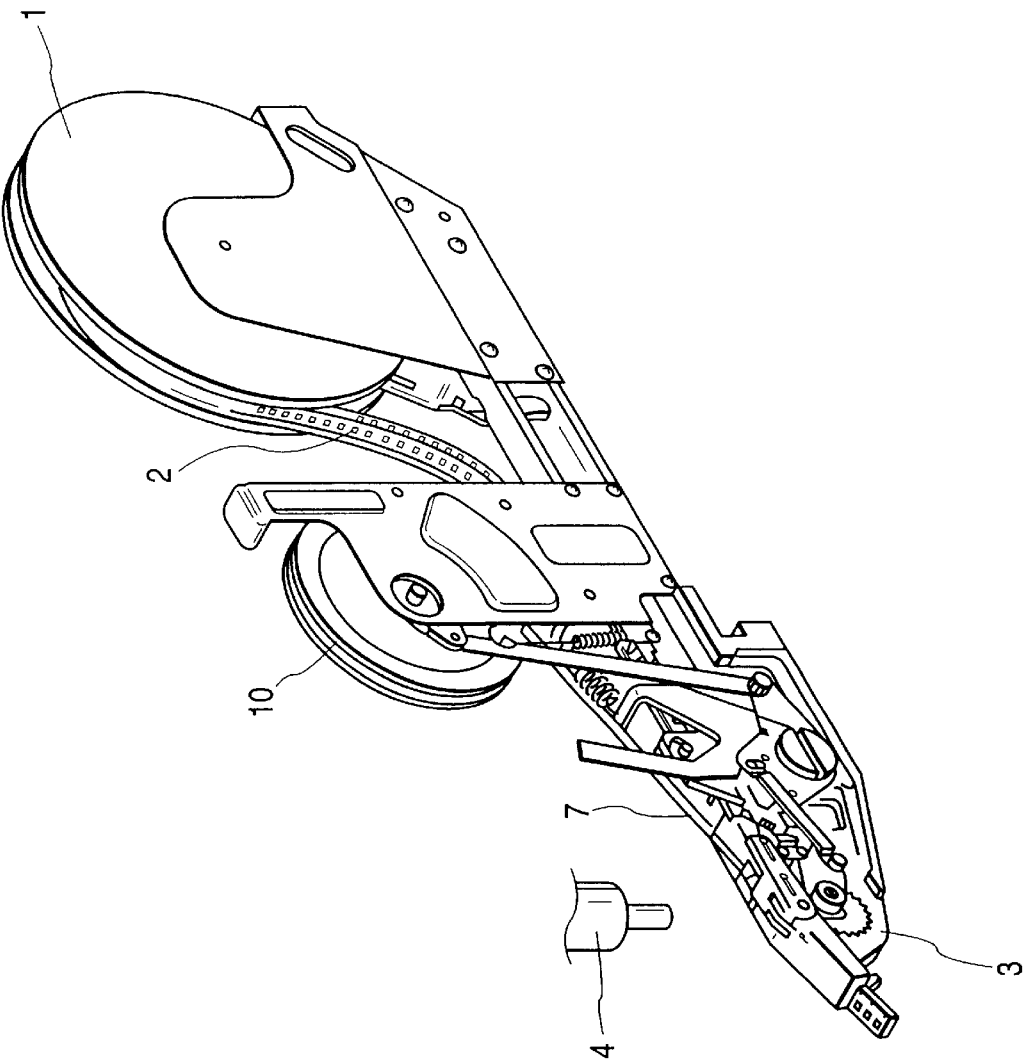
FIG. 1 is a perspective view which shows a parts feeder according to the present invention.

Referring now to the drawings, wherein like numbers refer to like parts in several views, particularly to FIG. 1, there is shown a parts feeder according to the present invention.

The parts feeder includes a supply reel 1, a strip carrier 2, a take-up reel 10, and a vacuum pickup 4.

The supply reel 1 has a strip carrier 2 wound therearound. The strip carrier 2 is moved by a ratchet wheel 3 intermittently to a pickup station over which the vacuum pickup 4 is disposed.

Figure 3:
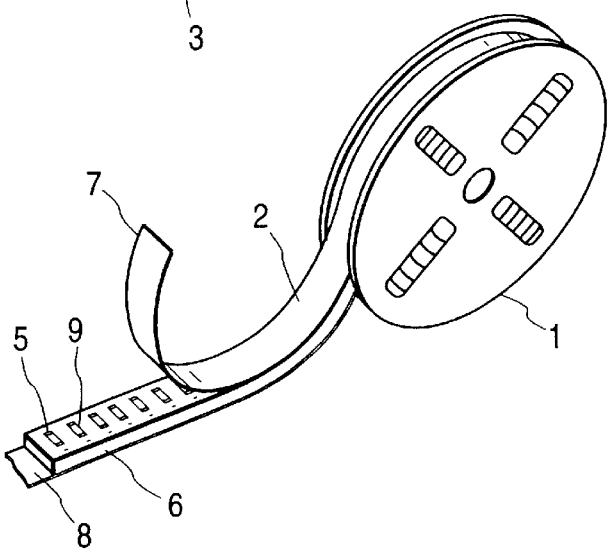
FIG. 3 is a perspective view which shows a strip carrier withdrawn from a supply reel.

The strip carrier 2, as clearly shown in FIG. 3, consists of a base tape 6, a cover tape 7, and a bottom tape 8. The base tape 6 has recesses or storage chambers 5 with upper openings formed in line along the length of the base tape 6. Parts 9 are stored one in each of the storage chambers 5. The cover tape 7 is attached to the upper surface of the base tape 6 to avoid dislodgment of the parts from the storage chambers 5.

The cover tape 7 is stripped from the base tape 6 prior to arrival at the pickup station and then wound around the take-up reel 10. The vacuum pickup 4 is moved downward in synchronism with movement of the strip carrier 7 through a mechanism (not shown) to suck up the parts 9 one by one.

Figure 2:
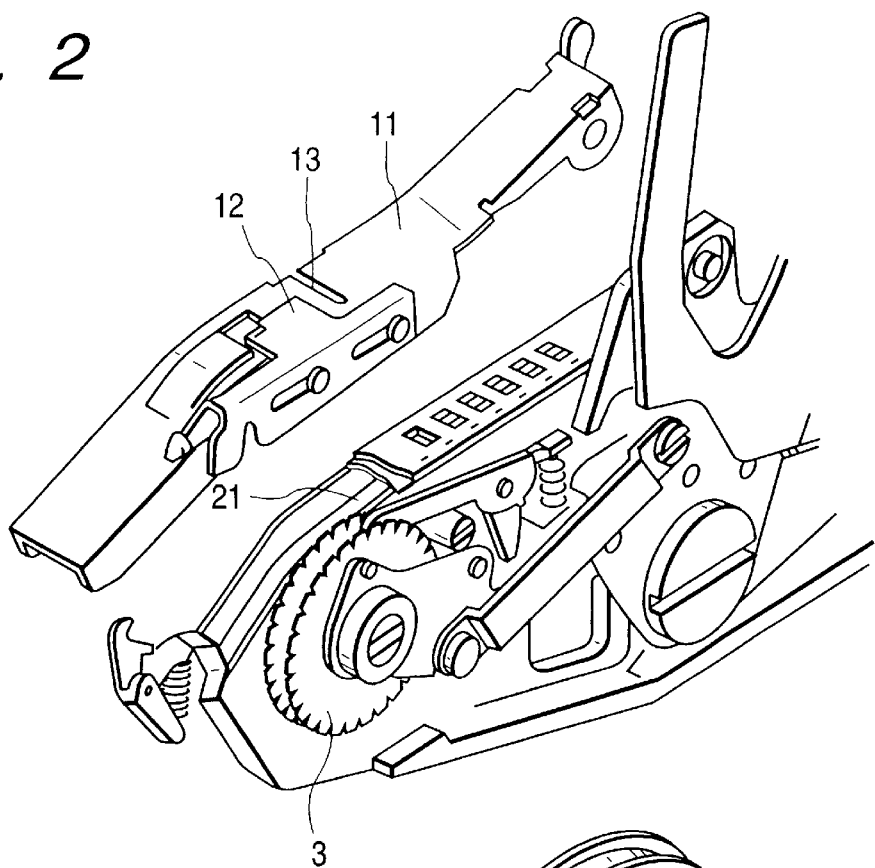
FIG. 2 is a partial perspective view which shows a structure of a pickup station.

A pressure cover 11, as shown in FIG. 2, is disposed between the vacuum pickup 4 and the strip carrier 2 to hold the strip carrier 2 from moving out of a travel path. The pressure cover 11 has a shutter 12. The shutter 12 is opened upon downward movement of the vacuum pickup 4 for picking up one of the parts 9 on the strip carrier 2. The pressure cover 11 has formed therein a slit 13 for peeling the cover tape 7 off the base tape 6. The cover tape 7 is pulled upward and taken up by the take-up reel 10.

Figure 10:
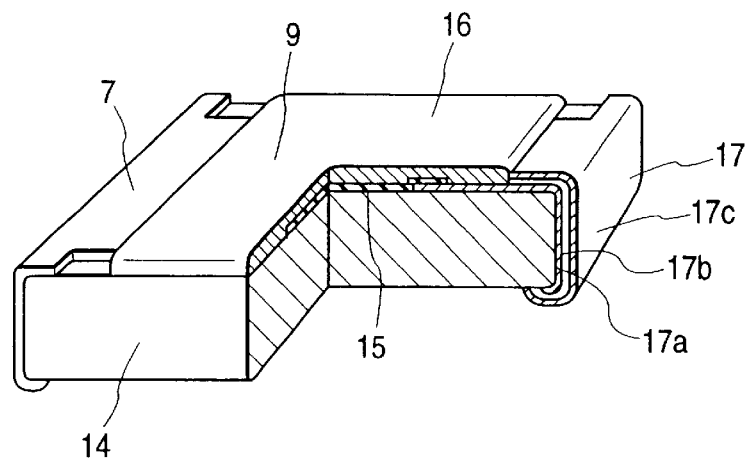
FIG. 10 is a partial sectional view which shows parts transported by a parts feeder according to the invention.

Each of the parts 9, as shown in FIG. 10, consists of a ceramic base plate 14, a resistor 15 formed on an upper surface of the base plate 14, a protective film 16 covering an upper surface of the resistor 15, and electrodes 17 mounted on both sides of the base plate 14. Each of the electrodes 17 has a three-layer structure which includes a lower layer 17a, an intermediate layer 17b, and an upper layer 17c. The lower layer 17a is made of Ag. The upper layer 17c is made of a solder material. The intermediate layer 17b is made of a magnetic material such as Ni so that each of the parts 9 can be attracted by a magnet.

Figure 4:
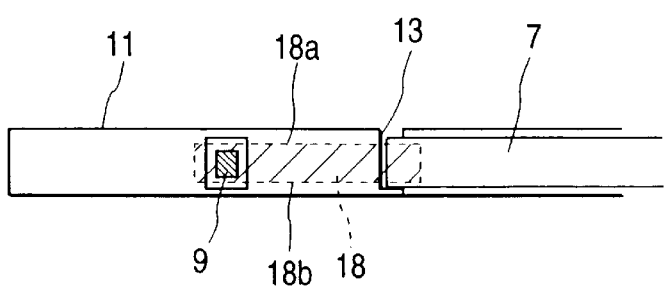
FIG. 4 is a plane view which shows a magnet disposed beneath a vacuum pickup.
Figure 5:
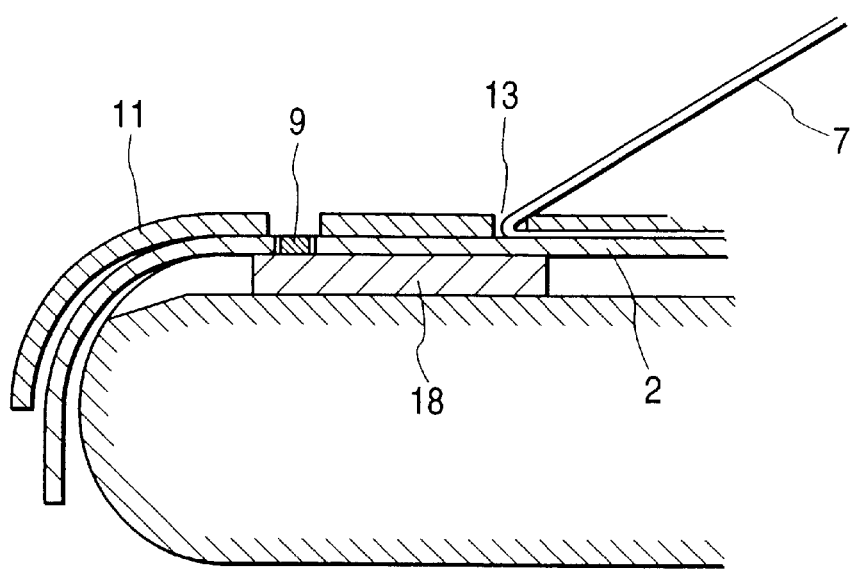
FIG. 5 is a partial side view which shows a magnet disposed it a pickup station.

A magnet 18, as clearly shown in FIGS. 4 and 5, is disposed at the pickup station on the travel path beneath the vacuum pickup 4. The magnet 18 is installed, as shown in FIGS. 2 and 5, on an upper mount surface 21 of a chassis and has a non-pole face formed on an upper surface thereof, as viewed in FIG. 5, facing the strip carrier 2 (i.e., the vacuum pickup 4) so as not to impinge on picking up of the parts 9 by the vacuum pickup 4.

The vibrations produced by intermittent movements of the strip carrier 2, as described above, may cause some of the parts 9 in the storage chambers 5 of the strip carrier 2 to stand vertically or to be lifted at one end thereof on an upper corner of the storage chambers 5, which will result in difficulty in picking up them in a suitable orientation through the vacuum pickup 4.

The magnet 18 which is mounted beneath the vacuum pickup 4 and which has the non-pole face formed on the upper surface thereof opposed to the vacuum pickup 4 serves to keep the parts 9 flat within the storage chambers 5, respectively, thereby allowing the vacuum pickup 4 to pickup each of the parts 9 in a horizontal orientation. The reason why the parts 9 are held within the storage chambers 5 without jumping out thereof by forming the non-pole face on the upper surface of the magnet 18 may be because the two electrodes 17 of each of the parts 9 are, as clearly shown in FIG. 6, aligned with a magnetic flux extending from the N-pole 18a to the S-pole 18b provided at both sides of the magnet 18 so that the parts 9 are kept horizontally within the storage chambers 5.

Figure 7:
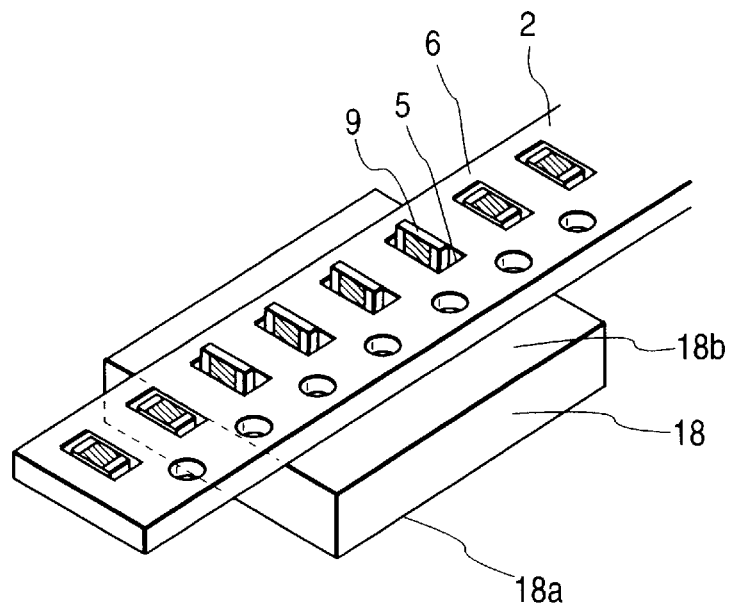
FIG. 7 is a partial perspective view which shows parts elevated vertically by vibrations of a strip carrier during movement.

If either of the N-pole 18a and the S-pole 18b is, unlike this embodiment, oriented toward the strip carrier 2, results of tests performed by the inventors of this application showed that some of the parts 9, as shown in FIG. 7, stood up within the storage chambers 5 by the vibrations of the strip carrier 2 produced during movement.

The magnet 18 has a length, as shown in FIGS. 4 and 5, extending from an upstream side of the slit 13 which strips the cover tape 7 off the base tape 6 in an upward direction to a downstream side of the vacuum pickup 4. Specifically, the magnetic force produced from the magnet 18 acts directly on each of the parts 9 immediately after the cover tape 7 is stripped off the strip carrier 2, thus preventing the parts 9 from standing undesirably.

The magnet 18 has also a width, as shown in FIG. 4, greater than that of the parts 9, thereby preventing the parts 9 from being elevated by a portion of the magnetic flux extending vertically from each of magnetic poles (i.e., the N-pole and the S-poles).

Figure 6:
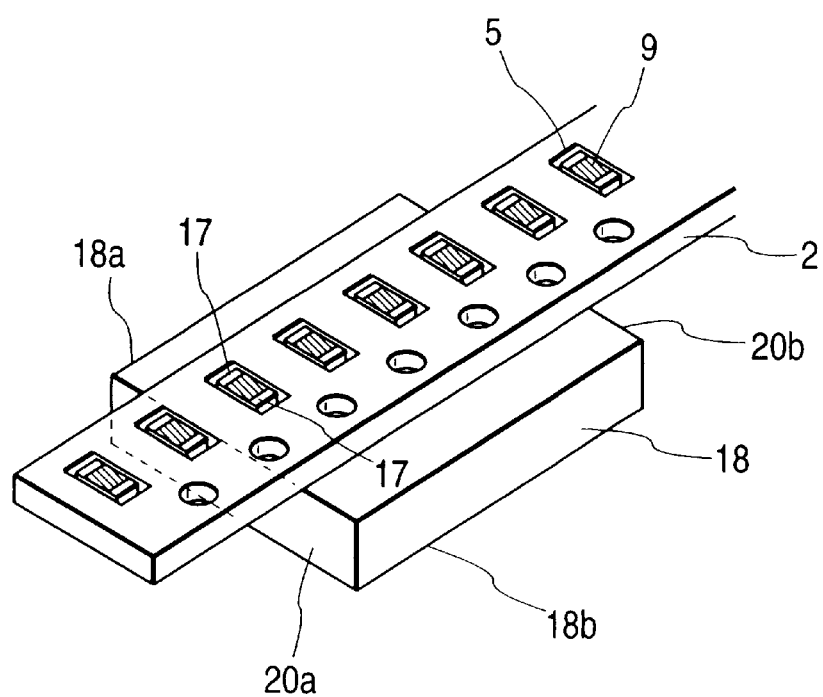
FIG. 6 is a partial perspective view which shows a positional relation between a magnet and a strip carrier.

The magnet 18 may alternatively have the N-pole 18a and the S-pole 18b, as shown in FIG. 6, formed on opposed end surfaces 20a and 20b. In this case, the magnetic flux of the magnet 18 extends longitudinally of the strip carrier 2, that is, past the width of the parts 9. Specifically, the magnetic flux of the magnet 18 passes through each of the parts 9 from one end surface to the other end surface, as shown in FIG. 10, on which the electrodes 17 are not formed. In other words, the magnetic flux passes through the ceramic base plate 14 in parallel to the electrodes 17, thereby holding the parts 9 flat within the storage chambers 5 more effectively.

The magnet 18 is a ferrite magnet which is easy to machine to various shapes and which has a magnetic force suitable for holding the parts 9 flat within the storage chambers 5.

Figure 8:
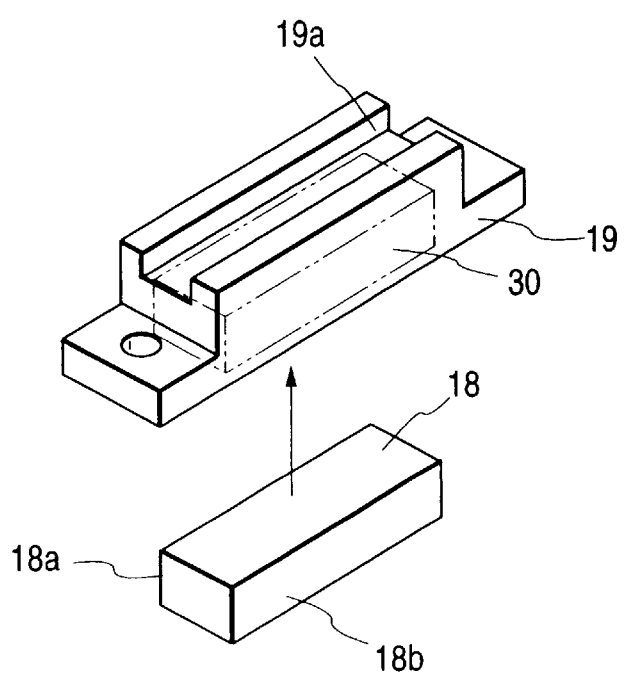
FIG. 8 is a perspective view which shows a support member used in a second embodiment of a parts feeder.

FIG. 8 shows the second embodiment of the parts feeder which is different from the first embodiment only in that a support member 19 is disposed at the pickup station on which the strip carrier 2 slides. Other arrangements are identical, and explanation thereof in detail will be omitted here.

Figures 9A, 9B, 9C:
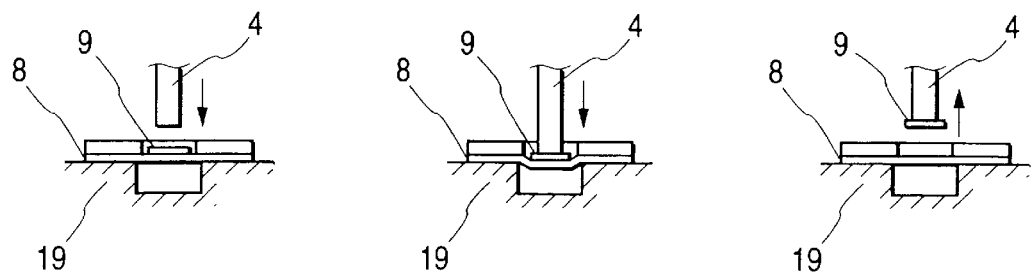
FIGS. 9(a), 9(b), and 9(c) are partial sectional views which show a sequence of pickup operations in the second embodiment.

The support member 19 has a groove 19a formed in an upper surface thereof which has the width greater than the opening of each of the storage chambers 5 in the strip carrier 2 and smaller than the width of the strip carrier 2. When the vacuum pickup 4 picks up one of the parts 9, the vacuum pickup 4 is, as shown in FIG. 9(a), moved downward and presses the one of the parts 9 against the bottom tape 8, so that the one of the parts 9 may stick in the bottom tape 8. However, in the second embodiment, when the pickup 4 presses one of the parts 9, the bottom tape 8 is, as shown in FIG. 9(b), flexed into the groove 19a of the support member 19, thereby preventing the one of the parts 9 from sticking in the bottom tape 8.

The support member 19 is made of an elastic non-magnetic material and may hold the strip carrier 2 elastically between itself and the pressure cover 11 to avoid waving of the strip carrier 2 and to avoid the parts 9 jumping out of the storage chambers 5 during movement of the strip carrier 2.

The support member 19 has, as shown in FIG. 8, a chamber 30 formed in the bottom thereof. The magnet 18 is mounted in the chamber 30 so as to keep the magnetic force acting on the parts 9 at a given level. The chamber 30 may alternatively open into the groove 19a to expose the upper surface (i.e., the non-pole face) of the magnet to the groove 19a for increasing the magnetic force acting on the parts 9.

Figure 11:
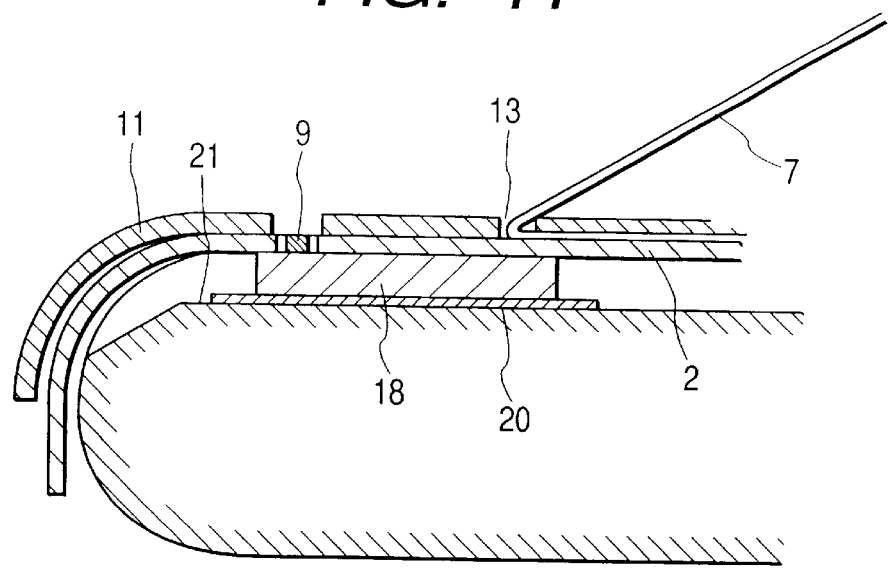
FIG. 11 is a partial side view which shows a spacer to adjust the distance between a magnet and parts.
Figure 12:
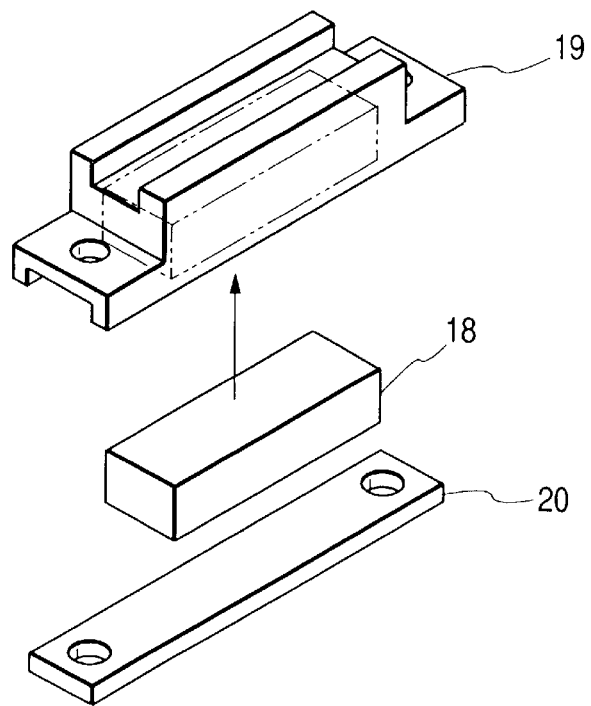
FIG. 12 is a perspective view which shows a modification of arrangement of the spacer shown in FIG. 11.

A distance adjuster may be provided which is capable of adjusting the distance between each of the parts 9 and the non-magnetic face of the magnet 18 to adjust the magnetic force of the magnet 18 to a level required to keep the parts 9 flat within the storage chambers 5. For instance, a spacer 20 having a preselected thickness, as shown in FIG. 11, may be interposed between the mount surface 21 and the bottom of the magnet 18 or, as shown in FIG. 12, mounted on the bottom of the magnet 18 installed in the support member 19. A height adjustable mechanism (not shown) using screws may alternatively be used.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

What is claimed is:

1. A parts feeding apparatus comprising:
   a pickup station;
   a strip carrier moved intermittently to said pickup station along a given travel path, said strip carrier having storage chambers arrayed in a lengthwise direction thereof, the storage chambers having openings and storing therein parts each of which is made of a plate member and has electrodes formed on ends thereof, the electrodes having at least a magnetic portion;
   a pickup picking up one of the parts from a corresponding one of the openings of the storage chambers of said strip carrier upon arriving at said pickup station; and
   a magnet disposed at said pickup station so as to be opposed to said pickup through said strip carrier for magnetically keeping each of the parts in a desired orientation within one of the storage chambers, said magnet having a non-pole face oriented to said strip carrier.

2. A parts feeding apparatus as set forth in claim 1, wherein said strip carrier also has a cover tape covering the openings of the storage chambers, and further comprising a stripping portion disposed upstream of said pickup station to strip the cover tape off the strip carrier, and wherein said magnet has a length extending from an upstream side of the stripping portion to a downstream side of said pickup.

3. A parts feeding apparatus as set forth in claim 1, further comprising a non-magnetic supporting member disposed over said magnet on which said strip carrier moves, said supporting member having a recessed portion greater than each of the openings of said storage chambers.

4. A parts feeding apparatus as set forth in claim 3, wherein said supporting member is made of an elastic material, and further comprising a pressure member disposed so as to urge said strip carrier against said supporting member.

5. A parts feeding apparatus as set forth in claim 3, wherein said magnet is disposed within said supporting member.

6. A parts feeding apparatus as set forth in claim 3, wherein said magnet is disposed within said supporting member so as to expose the non-pole face to the recessed portion of said supporting member.

7. A parts feeding apparatus as set forth in claim 1, further comprising distance adjusting means for adjusting a distance between the parts and the non-pole face of said magnet.

8. A parts feeding apparatus as set forth in claim 1, wherein each of the parts has an upper surface, a lower surface, a pair of first opposed side surfaces, and a pair of second opposed side surfaces formed adjacent the first opposed surfaces, each of the electrodes extending from an end portion of the upper surface to an end portion of the lower surface across one of the first opposed surfaces without occupying the second opposed surfaces.

9. A parts feeding apparatus as set forth in claim 1, wherein said magnet is a ferrite magnet.

10. A parts feeding apparatus comprising:
    a pickup station;
    a strip carrier moved intermittently to said pickup station along a given travel path, said strip carrier having storage chambers arrayed in a lengthwise direction thereof, the storage chambers having openings and storing therein parts each of which is made of a plate member and has electrodes formed on ends thereof, the electrodes having at least a magnetic portion;
    a pickup picking up one of the parts from a corresponding one of the openings of the storage chambers of said strip carrier upon arriving at said pickup station; and
    a magnet disposed at said pickup station beneath said pickup, said magnet having a length extending from a downstream side to an upstream side of said pickup for magnetically keeping each of the parts in a desired orientation within one of the storage chambers, said magnet having a non-pole face oriented to said strip carrier.

11. A parts feeding apparatus as set forth in claim 10, wherein said strip carrier also has a cover tape covering the openings of the storage chambers, and further comprising a stripping portion disposed upstream of said pickup station to strip the cover tape off the strip carrier, and wherein the length of said magnet extends from an upstream side of the stripping portion to the downstream side of said pickup.

12. A parts feeding apparatus as set forth in claim 10, further comprising a non-magnetic supporting member disposed over said magnet on which said strip carrier moves, said supporting member having a recessed portion greater than each of the openings of said storage chambers.

13. A parts feeding apparatus as set forth in claim 12, wherein said supporting member is made of an elastic material, and further comprising a pressure member disposed so as to urge said strip carrier against said supporting member.

14. A parts feeding apparatus as set forth in claim 12, wherein said magnet is disposed within said supporting member.

15. A parts feeding apparatus as set forth in claim 12, wherein said magnet is disposed within said supporting member so as to expose the non-pole face to the recessed portion of said supporting member.

16. A parts feeding apparatus as set forth in claim 10, further comprising distance adjusting means for adjusting a distance between the parts and the non-pole face of said magnet.

17. A parts feeding apparatus as set forth in claim 10, wherein each of the parts has an upper surface, a lower surface, a pair of first opposed side surfaces, and a pair of second opposed side surfaces formed adjacent the first opposed surfaces, each of the electrodes extending from an end portion of the upper surface to an end portion of the lower surface across one of the first opposed surfaces without occupying the second opposed surfaces.

18. A parts feeding apparatus comprising:
 a pickup station;
 a strip carrier moved intermittently to said pickup station along a given travel path, said strip carrier having storage chambers arrayed in a lengthwise direction thereof, the storage chambers having openings and storing therein parts each of which is made of a plate member and has electrodes formed on ends thereof, the electrodes having at least a magnetic portion;
 a pickup picking up one of the parts from a corresponding one of the openings of the storage chambers of said strip carrier upon arriving at said pickup station; and
 a magnet disposed at said pickup station, said magnet having a length extending from at least a lower side of said pickup to an upstream side of said pickup for magnetically keeping each of the parts in a desired orientation within one of the storage chambers, said magnet having a non-pole face oriented to said strip carrier and a width in a direction perpendicular to a length of said strip carrier which is greater than that of the parts.

19. A parts feeding apparatus as set forth in claim 18, wherein said strip carrier also has a cover tape covering the openings of the storage chambers, and further comprising a stripping portion disposed upstream of said pickup station to strip the cover tape off the strip carrier, and wherein the length of said magnet extends from an upstream side of the stripping portion to a downstream side of said pickup.

20. A parts feeding apparatus as set forth in claim 18, further comprising a non-magnetic supporting member disposed over said magnet on which said strip carrier moves, said supporting member having a recessed portion greater than each of the openings of said storage chambers.

21. A parts feeding apparatus as set forth in claim 20, wherein said supporting member is made of an elastic material, and further comprising a pressure member disposed so as to urge said strip carrier against said supporting member.

22. A parts feeding apparatus as set forth in claim 20, wherein said magnet is disposed within said supporting member.

23. A parts feeding apparatus as set forth in claim 20, wherein said magnet is disposed within said supporting member so as to expose the non-pole face to the recessed portion of said supporting member.

24. A parts feeding apparatus as set forth in claim 18, further comprising distance adjusting means for adjusting a distance between the parts and the non-pole face of said magnet.

25. A parts feeding apparatus as set forth in claim 18, wherein each of the parts has an upper surface, a lower surface, a pair of first opposed side surfaces, and a pair of second opposed side surfaces formed adjacent the first opposed surfaces, each of the electrodes extending from an end portion of the upper surface to an end portion of the lower surface across one of the first opposed surfaces without occupying the second opposed surfaces.

* * * * *